US012597913B2

(12) United States Patent
Xia et al.

(10) Patent No.: US 12,597,913 B2
(45) Date of Patent: Apr. 7, 2026

(54) FOLDED RAMP GENERATOR

(71) Applicant: Texas Instruments Incorporated, Dallas, TX (US)

(72) Inventors: Yinglai Xia, Plano, TX (US); Shailendra Kumar Baranwal, Murphy, TX (US); Yogesh Kumar Ramadass, San Jose, CA (US); Junmin Jiang, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/512,158

(22) Filed: Nov. 17, 2023

(65) Prior Publication Data

US 2024/0088878 A1     Mar. 14, 2024

Related U.S. Application Data

(62) Division of application No. 17/832,280, filed on Jun. 3, 2022, now Pat. No. 11,824,543, which is a division of application No. 17/119,604, filed on Dec. 11, 2020, now Pat. No. 11,356,082.

(60) Provisional application No. 62/947,267, filed on Dec. 12, 2019.

(51) Int. Cl.

| | |
|---|---|
| *H03K 4/08* | (2006.01) |
| *H03F 3/217* | (2006.01) |
| *H03K 19/20* | (2006.01) |
| *H03L 7/081* | (2006.01) |
| *H03L 7/089* | (2006.01) |
| *H03L 7/099* | (2006.01) |

(52) U.S. Cl.
CPC ............. *H03K 4/08* (2013.01); *H03F 3/2173* (2013.01); *H03L 7/081* (2013.01); *H03L

*7/0891* (2013.01); *H03L 7/099* (2013.01); *H03F 2200/03* (2013.01); *H03K 19/20* (2013.01)

(58) Field of Classification Search
CPC .... H03F 2200/03; H03F 3/2173; H03F 3/183; H03K 19/20; H03K 4/08; H03L 7/081; H03L 7/0891; H03L 7/099; H03L 2207/06
See application file for complete search history.

(56) References Cited

U.S. PATENT DOCUMENTS

| | | |
|---|---|---|
| 5,994,960 A | 11/1999 | Baschirotto et al. |
| 7,076,070 B2 | 7/2006 | Pearce et al. |
| 7,078,971 B2 | 7/2006 | Colbeck |
| 7,589,587 B2 | 9/2009 | Yoshida et al. |
| 9,595,974 B1 | 3/2017 | Pereira et al. |
| 9,991,801 B2 | 6/2018 | Wang et al. |
| 10,886,881 B2 | 1/2021 | Xia et al. |
| 2005/0017799 A1 | 1/2005 | Risbo et al. |
| 2011/0095837 A1 | 4/2011 | Wilson |

(Continued)

*Primary Examiner* — Diana J. Cheng
(74) *Attorney, Agent, or Firm* — Zhenhai Fu

(57) ABSTRACT

In one example, an apparatus comprises a power stage having a first power stage input, a second power stage input, and a power stage output. The apparatus also comprises a modulator circuit having a first ramp input, a second ramp input, a modulator input, a first modulator output, and a second modulator output, the first modulator output coupled to the first power stage input, and the second modulator output coupled to the second power stage input. The apparatus also comprises a multi-level ramp generator having a first ramp output and a second ramp output, the first ramp output coupled to the first ramp input, and the second ramp output coupled the second ramp input.

21 Claims, 8 Drawing Sheets

200

(56)        References Cited

U.S. PATENT DOCUMENTS

2017/0055076  A1      2/2017   Buono et al.
2020/0340111  A1     10/2020   Kikuchi et al.

202

CLK_REF

412
VCM_HI
414
VCM_MID
416
VCM_LO

BIAS VCM
GENERATOR
402

418
HIGH
RAMP
406

REFHI_HI
420
REFHI_LO
412
VCM_HI

218
RAMP_HI

418
REFHI_HI
420
REFHI_LO
422
REFMID_HI

REFERENCE
VOLTAGE
GENERATOR
404

REFMID_LO
424
REFLO_HI
426
REFLO_LO
428

422
MIDDLE
RAMP
408

REFMID_HI
REFMID_LO
424
VCM_MID

220
RAMP_MID

414
LOW
RAMP
410

REFLO_HI
426
REFLO_LO
428
VCM_LO
416

RAMP_LO
222

700
702

CLK_RAMP(HI) —— CLK

DFF   Q —— CLK_RAMP_HI_MASK

CLK_RAMP(MID) —— D

FOLDED RAMP GENERATOR

CROSS-REFERENCE TO RELATED APPLICATIONS

This application is a divisional of U.S. patent application Ser. No. 17/832,280 filed Jun. 3, 2022, which is a divisional of U.S. patent application Ser. No. 17/119,604 filed Dec. 11, 2020, now U.S. Pat. No. 11,356,082, which claims priority to U.S. Provisional Patent Application No. 62/947,267 filed Dec. 12, 2019, all of which are hereby incorporated herein by reference.

BACKGROUND

A class-D amplifier is useful in battery-powered audio applications. In one example, a multi-level class-D amplifier is coupled to a charge pump, which increases a voltage from a power supply to deliver higher power to a load (e.g., a speaker). In a multi-level class-D amplifier, the pulse width modulated output switches between three voltage levels. In one case, the three voltage levels are ground, a battery voltage, and a linked voltage from the charge pump. In some such systems, two ramp generators provide triangular voltage waveforms that are compared to an input signal to be amplified. The comparison between the input signal and the two ramps results in pulse width modulated signals. These pulse width modulated signals are provided to a controller in the amplifier, in order to control an output stage of the amplifier.

SUMMARY

In at least one example, a device includes a first ramp generator having a first ramp generator output configured to provide a first ramp, a second ramp generator having a second ramp generator output configured to provide a second ramp, and a third ramp generator having a third ramp generator output configured to provide a third ramp. The first ramp is a sawtooth voltage waveform having a first common mode voltage and a first peak-to-peak voltage. The second ramp is a sawtooth voltage waveform having a second common mode voltage and a second peak-to-peak voltage. The third ramp is a sawtooth voltage waveform having a third common mode voltage and a third peak-to-peak voltage. A frequency of the second ramp is approximately equal to a frequency of the third ramp, and the frequency of the third ramp is approximately double a frequency of the first ramp.

In another example, a device includes a first ramp generator having first ramp generator inputs configured to receive a first common mode level, a reference clock signal, a first high voltage reference signal, and a first low voltage reference signal. The first ramp generator includes a first delay locked loop having a first delay locked loop output and first delay locked loop inputs. The first delay locked loop inputs are configured to receive the reference clock signal and a first clock feedback signal. The first ramp generator also includes a first voltage controlled oscillator (VCO) coupled to the first delay locked loop. The first VCO has a first VCO ramp output and first VCO inputs. The first VCO inputs are configured to receive the first delay locked loop output, the first common mode level, the first high voltage reference signal, and the first low voltage reference signal. The first VCO ramp output is configured to provide a first ramp responsive to the first VCO inputs. The device also includes a second ramp generator having second ramp generator inputs configured to receive a second common mode level, the reference clock signal, a second high voltage reference signal, and a second low voltage reference signal. The second ramp generator includes a second delay locked loop having a second delay locked loop output and second delay locked loop inputs. The second delay locked loop inputs are configured to receive the reference clock signal and a second clock feedback signal. The second ramp generator also includes a second VCO coupled to the second delay locked loop. The second VCO has a VCO clock output, a second VCO ramp output and second VCO inputs. The second VCO inputs are configured to receive the second delay locked loop output, the second common mode level, the second high voltage reference signal, and the second low voltage reference signal. The second VCO is configured to provide a second ramp at the second VCO ramp output responsive to the second VCO inputs. The second ramp generator also includes a frequency divider coupled to the second VCO. The frequency divider has a frequency divider output and a frequency divider input. The frequency divider input is coupled to the VCO clock output and the frequency divider output is configured to provide the second clock feedback signal at the frequency divider output responsive to the frequency divider input. The device also includes a bias voltage common mode generator coupled to the first and second VCOs. The bias voltage common mode generator has a bias voltage common mode generator output and is configured to provide the first and second common mode levels at the bias voltage common mode generator output. The device also includes a reference voltage generator coupled to the first and second VCOs. The reference voltage generator has reference voltage generator outputs configured to provide the first and second high voltage reference signals and the first and second low voltage reference signals.

In yet another example, a device includes a multi-level ramp generator configured to provide a first ramp, a second ramp, and a third ramp. The device also includes a comparison logic circuit configured to compare each of the first, second, and third ramps to an input signal to be amplified; provide a first pulse width modulated (PWM) signal responsive to the comparison of the first ramp to the input signal; provide a second PWM signal responsive to the comparison of the second ramp to the input signal; provide a third PWM signal responsive to the comparison of the third ramp to the input signal; provide a first masked PWM signal by masking the second PWM signal with a first masking clock signal, the first masking clock signal derived from a ramp clock signal for the second ramp; provide a second masked PWM signal by masking the third PWM signal with a second masking clock signal, the second masking clock signal derived from a ramp clock signal for the third ramp; and provide control signals to an output stage of an amplifier responsive to the first PWM signal, the first masked PWM signal, and the second masked PWM signal.

DETAILED DESCRIPTION

In amplifier systems that compare two ramps to an input signal to be amplified, the use of only two ramps makes the amplifier susceptible to common mode noise and causes information loss in the negative part of the input signal.

To address that problem, examples described below include a multi-level ramp generator configured to provide three ramps, which include a high ramp, a middle ramp, and a low ramp. The high ramp and the low ramp are "folded" relative to the middle ramp, so each has a frequency approximately double that of the middle ramp. Also, the folded high ramp is approximately 180 degrees out of phase with the folded low ramp. In an example, the high ramp, middle ramp, and low ramp have different peak-to-peak magnitudes and different common mode levels. In these examples, the use of three ramp signals, each with different common mode levels, captures information related to the input signal that would be outside the voltage range covered by only two ramp signals. This reduces common mode error and the total harmonic distortion of an amplifier, by using the multi-level ramp generator described herein. Also, by folding the high ramp and the low ramp, the range of the overall multi-ramp provided by the multi-ramp generator is increased, which maintains increased linearity and makes the amplifier less susceptible to noise or other disturbances. These examples are described below.

Figure 1:
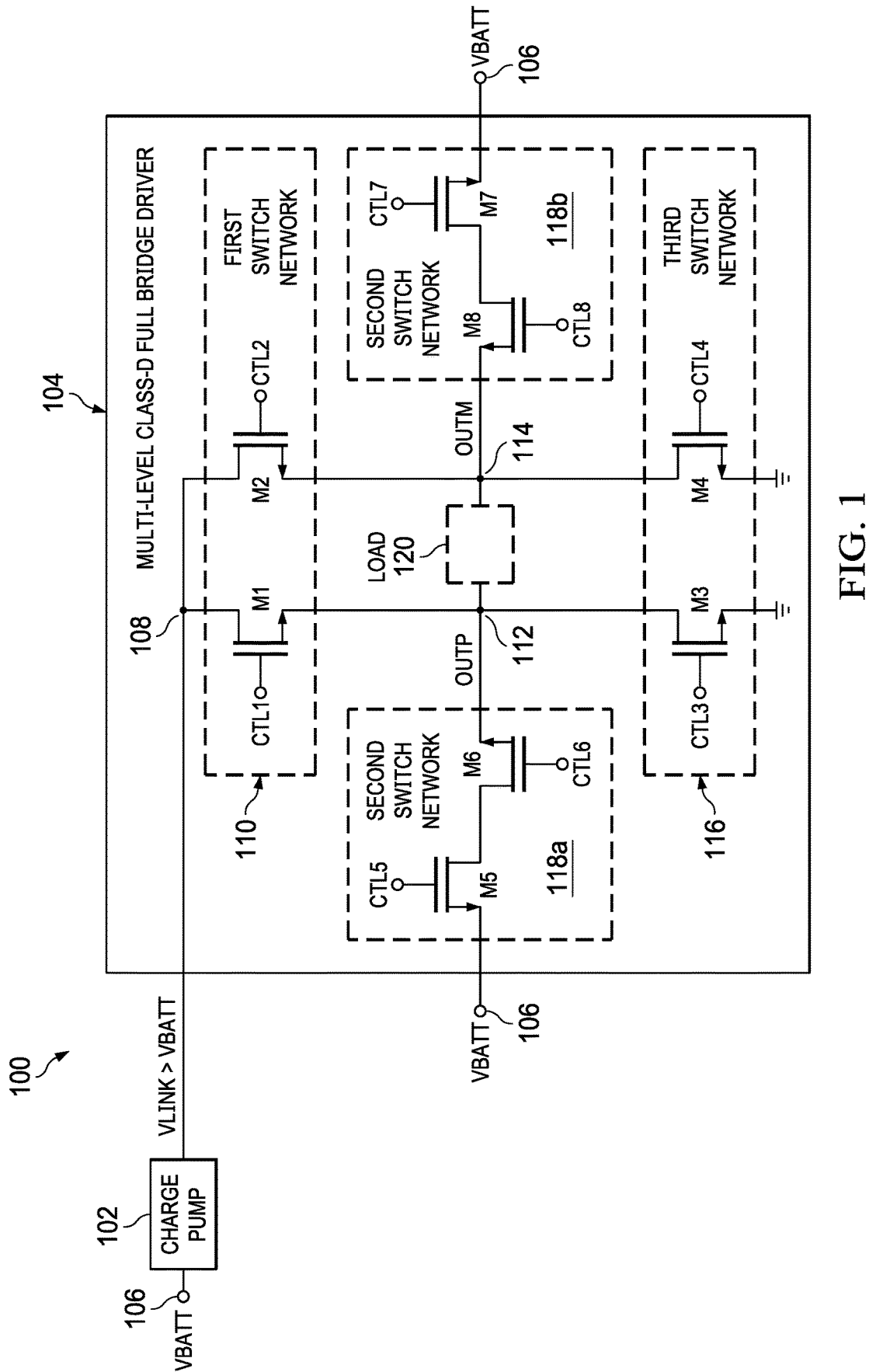
FIG. 1 is a schematic diagram of an output stage of an amplifier in various examples.

FIG. 1 is a schematic diagram of an output stage 100 of an amplifier in examples of this description. In FIG. 1, the output stage 100 includes a charge pump 102 and a multi-level class-D full bridge driver 104. The charge pump 102 is coupled to a voltage source node 106 and to a second node 108. In an example, the voltage source node 106 is coupled to a voltage source (not shown), so the voltage on the voltage source node 106 is voltage of that particular voltage source. In one example, the voltage source is a battery, although the voltage source can be other than a battery in other examples. The voltage source node 106 is labeled as "VBATT" to show the example in which the voltage source is a battery. The voltage source node 106 is referred to herein as the "VBATT node," while VBATT also refers to a voltage provided by the battery to the node 106.

Node 108 is labeled as "VLINK" because the node 108 links the charge pump 102 to the bridge driver 104. Node 108 is referred to herein as the "VLINK node," while VLINK also refers to a voltage provided by the charge pump 102 to the node 108. In various examples, the charge pump 102 is part of, or separate from, the amplifier's output stage 100. The charge pump 102 receives the voltage from the VBATT node 106 and provides an output voltage that is greater than the voltage on the VBATT node 106. The output voltage from the charge pump 102 is provided to the VLINK node 108. In this example, the charge pump 102 provides (as an output) a voltage that is three times the voltage at the VBATT node 106. But in other examples, the charge pump 102 provides a different increase in voltage.

The bridge driver 104 in the example of FIG. 1 includes eight transistors labeled as M1, M2, M3, M4, M5, M6, M7, and M8 arranged into three switch networks. The first switch network 110 includes M1 and M2. The drains of M1 and M2 connect to the VLINK node 108. The source of M1 is connected to a node 112, which represents the positive output node (OUTP) of the amplifier. The node 112 is sometimes referred to herein as the "OUTP node." The source of M2 is connected to a node 114, which represents the negative (minus) output node (OUTM) of the amplifier. The node 114 is sometimes referred to herein as the "OUTM node." Each of M1 and M2 is controlled by respective control signals labeled in FIG. 1 as CTL1 (for M1) and CTL2 (for M2) applied to the respective gates of M1 and M2. The first switch network 110 couples the VLINK node 108 to the OUTP node 112 and the OUTM node 114, so it also provides the voltage VLINK to the OUTP node 112 and to the OUTM node 114.

The third switch network 116 includes M3 and M4. The sources of M3 and M4 are connected to a common potential (e.g., a ground node). The drain of M3 is connected to the OUTP node 112, and the drain of M4 is connected to the OUTM node 114. M3 is controlled by control signal CTL3 applied to its gate. M4 is controlled by control signal CTL4 applied to its gate. The third switch network 116 couples the ground node to the OUTP node 112 and to the OUTM node 114.

The second switch network 118a includes M5 and M6, and the second switch network 118b includes M7 and M8. The sources of M5 and M7 connect to VBATT node 106. The drain of M5 is coupled to the drain of M6. The drain of M7 is coupled to the drain of M8. The source of M6 is coupled to the OUTP node 112. The source of M8 is coupled to the OUTM node 114. M5, M6, M7, and M8 are controlled by control signals applied to the respective gates of those transistors. M5 is controlled by control signal CTL5, M6 is controlled by control signal CTL6, M7 is controlled by control signal CTL7, and M8 is controlled by control signal CTL8. The second switch network 118a couples the VBATT node 106 to the OUTP node 112, so it also provides the voltage VBATT to the OUTP node 112. The second switch network 118b couples the VBATT node 106 to the OUTM node 114, so it also provides the voltage VBATT to the OUTM node 114.

In some examples, at least one of the transistors M1-M8 is a laterally diffused metal oxide semiconductor (LDMOS) field effect transistor (FET). In some implementations, the transistors M1-M8 are LDMOS transistors. In the example of FIG. 1, transistors M1-M8 are n-type LDMOS transistors. The bulk (sometimes called "back gate") connection of each transistor is connected to the source of the respective transistor. The transistors M1-M8 are shown as metal oxide semiconductor field effect transistors, but can be implemented as other types of transistors, such as bipolar junction transistors. In operation, the transistors M1-M8 of the output stage 100 provide voltage to the OUTP node 112 and to the OUTM node 114, and by extension to a load 120 (e.g., a speaker) coupled to them.

Figure 2:
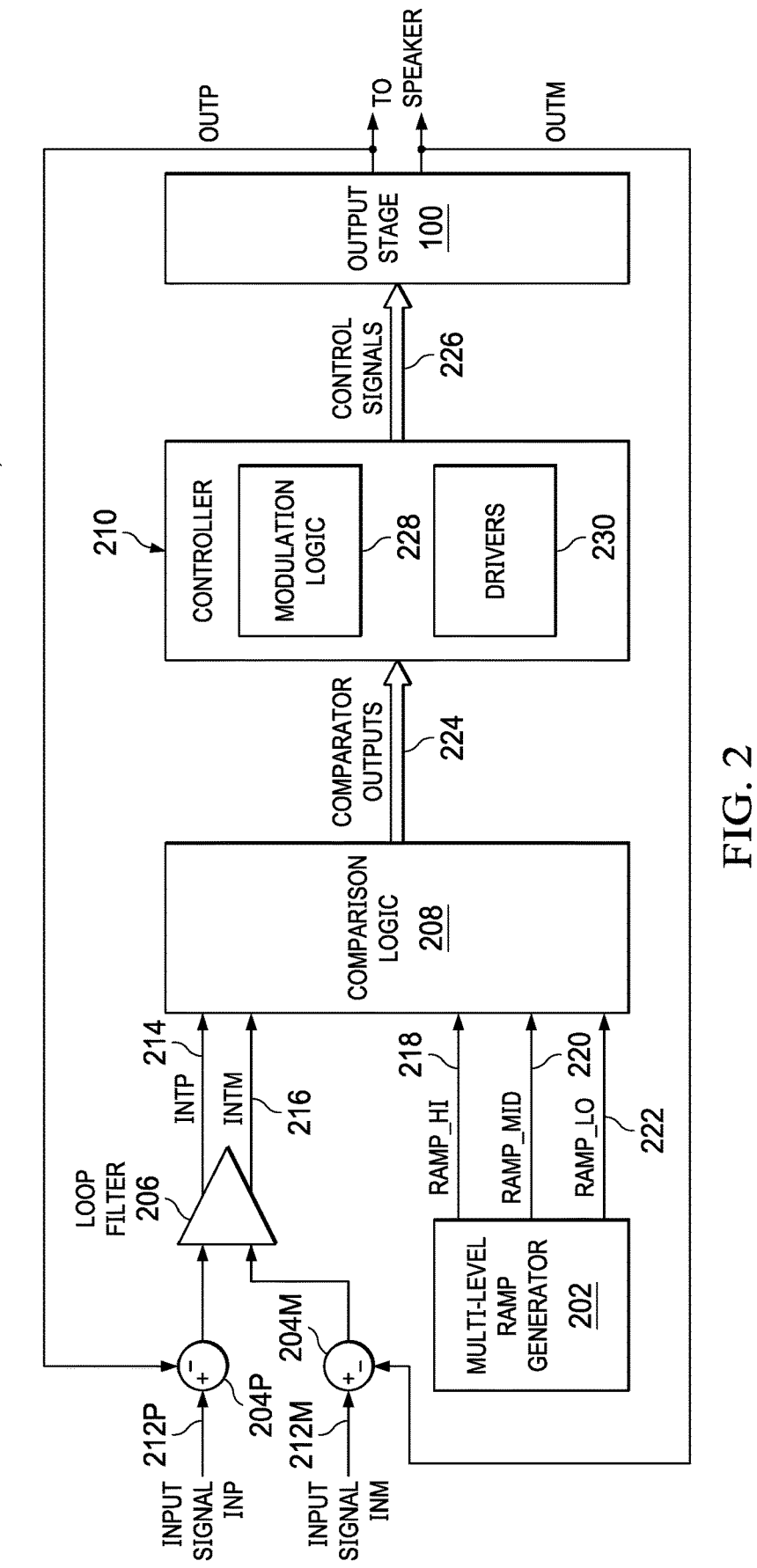
FIG. 2 is a block diagram of an amplifier including the output stage of FIG. 1 and an example multi-level ramp generator.

FIG. 2 is a block diagram of an example amplifier 200 including the output stage 100 described above with reference to FIG. 1 and a multi-level ramp generator 202. The amplifier 200 in this example also includes a subtractor 204P, a subtractor 204M, a loop filter 206, comparison logic 208, and a controller 210. An input signal 212 to be amplified includes two signals, which are INP 212P and INM 212M. In an example, the input signal 212 is a sinusoidal analog signal, such as a pre-amplified audio signal. INP 212P represents the positive input signal, and INM 212M represents the negative (minus) input signal. INP 212P is provided to the subtractor 204P, and INM 212M is provided to the subtractor 204M.

The difference signal from each subtractor 204 is then filtered by loop filter 206, such as a fourth-order filter, to provide two filtered input signals INTP 214 and INTM 216. Loop filter 206 compensates for non-linear factors in the amplifier 200, such as dead time. INTP 214 is provided responsive to INP 212P and has a similar shape as INP 212P. INTM 216 is provided responsive to INM 212M and has a similar shape as INM 212M. Multi-level ramp generator 202 provides three triangular voltage waveforms, which are RAMP_HI 218, RAMP_MID 220, and RAMP_LO 222. The three RAMP signals are compared to INTP 214 and INTM 216 by comparison logic 208 to provide pulse width modulated signals, which are the comparator outputs 224 provided to the controller 210.

In an example, the control signals described above are provided by the controller 210 and are labeled as control signals 226; however, other components of FIG. 2 (e.g., comparison logic 208) contribute to providing the control signals 226. The controller 210 includes modulation logic 228 and drivers 230. Modulation logic 228 and drivers 230 provide the control signals CTL1-CTL8 (described above with reference to FIG. 1), which are provided to the gates of M1-M8 in the output stage 100. The control signals 226 are provided by controller 210 to the output stage 100. The output signal (e.g., the voltages on the OUTP node 112 and the OUTM node 114) is provided by the output stage 100 to the speaker and also serves as a feedback signal to the subtractors 204.

Figures 3A, 3B, 3C:
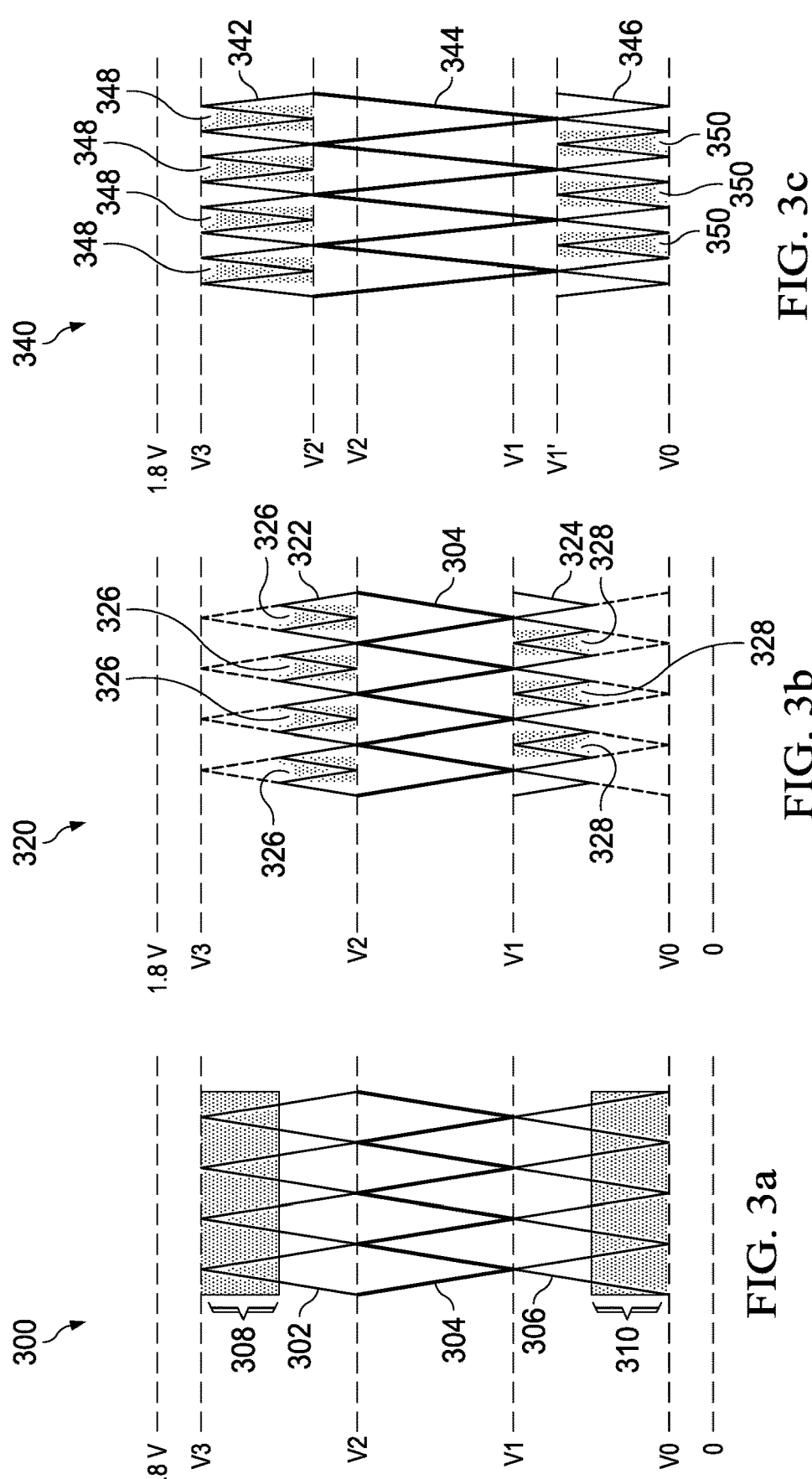
FIGS. 3a, 3b and 3c are graphs of various waveforms that demonstrate a folded multi-level ramp provided by the multi-level ramp generator of FIG. 2 in various examples.

FIGS. 3a, 3b and 3c are graphs of various waveforms that demonstrate a folded multi-level ramp, which is provided by the multi-level ramp generator 202 of FIG. 2. For example, FIG. 3a is a graph of a multi-level ramp 300 before being folded. The multi-level ramp 300 includes an unfolded high ramp 302, a middle ramp 304, and an unfolded low ramp 306, each of which is a sawtooth voltage waveform. The unfolded high ramp 302 has a minimum voltage of V2 and a maximum voltage of V3. The middle ramp 304 has a minimum voltage of V1 and a maximum voltage of V2. The unfolded low ramp 306 has a minimum voltage of V0 and a maximum voltage of V1. However, in one case, the amplitude of the input signals (e.g., INP 212P, INM 212M, INTP 214, INTM 216) is relatively large, such as where: (a) the positive half cycle of the positive, filtered input signal INTP 214 is in the upper region 308 relative to the unfolded high ramp 302; and (b) the negative half cycle of the negative, filtered input signal INTM 216 is in the lower region 310 relative to the unfolded low ramp 306. In this case, the pulse width modulated signals (which would be provided based on the comparison of the unfolded high ramp 302 and the unfolded low ramp 306 to the input signals INTP 214, INTM 216) have a 100% duty cycle, irrespective of the amount of input signal INTP 214, INTM 216 excursion into the upper and lower regions 308, 310. Thus, using the unfolded high ramp 302 and unfolded low ramp 306 results in an effective region of operation that excludes the upper region 308 and the lower region 310. This smaller, effective ramp height results in increased susceptibility to noise, disturbances, and other non-idealities in the input signals INTP 214, INTM 216.

In an example, FIG. 3b is a graph of a multi-level ramp 320 in which the high and low ramps are folded relative to the multi-level ramp 300 of FIG. 3a. For example, the multi-level ramp 320 includes a folded high ramp 322 (e.g., RAMP_HI 218) and a folded low ramp 324 (e.g., RAMP_LO 222), which are also sawtooth voltage waveforms. The middle ramp 304 (e.g., RAMP_MID 220) is similar to that described above with respect to FIG. 3a. The resultant folded high ramp 322 has a frequency approximately double that of the unfolded high ramp 302. The folded high ramp 322 also has an amplitude approximately half that of the unfolded high ramp 302 (e.g., has a minimum voltage of V2 and a maximum voltage of the average of V2 and V3). The resultant folded low ramp 324 has a frequency approximately double that of the unfolded low ramp 306. The folded low ramp 324 also has an amplitude approximately half that of the unfolded low ramp 306 (e.g., has a minimum voltage of the average of V0 and V1 and a maximum voltage of V1). Thus, the resultant folded high and low ramps 322, 324 have frequencies approximately double that of the middle ramp 304. Also, the folded high ramp 322 is approximately 180 degrees out of phase with the folded low ramp 324. As described below, portions (e.g., the regions 326, 328 of FIG. 3b) of the resulting pulse width modulated signals (which would be provided based on the comparison of the folded high ramp 322 and the folded low ramp 324 to the input signals INTP 214, INTM 216) are masked to correct for, or otherwise mitigate, the impact of doubling the frequency of the folded high and low ramps 322, 324 relative to the unfolded high and low ramps 302, 306, respectively.

In another example, FIG. 3c is a graph of a multi-level ramp 340 in which the high and low ramps are folded as in FIG. 3b. But the range of the multi-level ramp 340 is expanded to an increased range, such as from V0 to V3, rather than the average of V0 and V1 to the average of V2 and V3 as in FIG. 3b. In the example of FIG. 3c, each of a folded high ramp 342 (e.g., RAMP_HI 218), a middle ramp 344 (e.g., RAMP_MID 220), and a folded low ramp 346 (e.g., RAMP_LO 222) are expanded (e.g., in amplitude) relative to the folded high ramp 322, the middle ramp 304, and the folded low ramp 324 of FIG. 3b. For example, the folded high ramp 342 has a minimum voltage of V2' and a maximum voltage of V3. The middle ramp 344 has a minimum voltage of V1' and a maximum voltage of V2'. The folded low ramp 346 has a minimum voltage of V0 and a maximum voltage of V1'.

In an example, the voltage difference between V3 and V2', the voltage difference between V2' and V1', and the voltage difference between V1' and V0 (referred to as the peak-to-peak voltage for the ramps) are selected to maintain a substantially constant gain from the input of the comparators to the output of the final output stage 100. For example, the peak-to-peak voltages for RAMP_HI 218 and RAMP_LO 222 are chosen to have the same ratio as the difference between VLINK and VBATT. In an example, the peak-to-peak voltage for RAMP_MID 220 is chosen to have the same ratio as the difference between VBATT and ground. In an example, RAMP_HI 218, RAMP_MID 220, and RAMP_LO 222 have different peak-to-peak magnitudes and different common mode levels as shown. In these examples, the use of three ramp signals, each with different common mode levels, captures information related to the negative parts of INTP 214 and INTM 216 that would be outside the voltage range covered by only two ramp signals. This reduces common mode error and the total harmonic distortion of the amplifier 200. Also, by folding the high ramp 342 and the low ramp 346, the range of the overall multi-level ramp 340 provided by multi-level ramp generator 202 is increased, which maintains increased linearity and renders the amplifier 200 less susceptible to noise or other distur-
bances. Similar to FIG. 3b, and as described below, portions
(e.g., the regions 348, 350 of FIG. 3c) of the resulting pulse
width modulated signals (which would be provided based on
the comparison of the folded high ramp 342 and the folded
low ramp 346 to the input signals INTP 214, INTM 216) are
masked to correct for, or otherwise mitigate, the impact of
doubling the frequency of the folded high and low ramps
342, 346 relative to the unfolded high and low ramps 302,
306, respectively.

Figures 4, 7A:
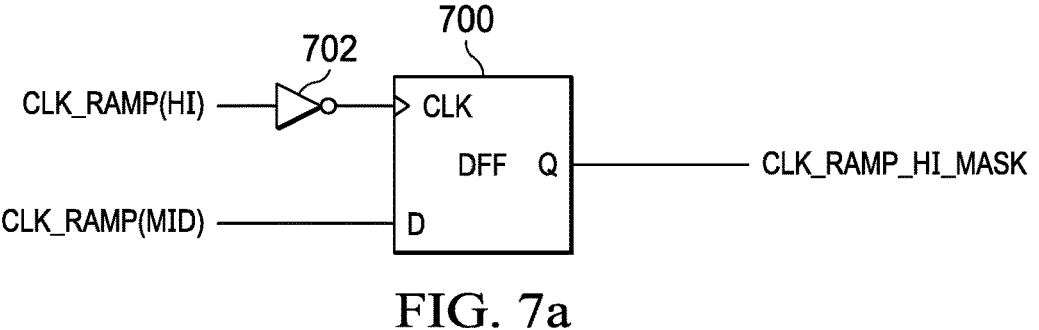
FIG. 4 is a block diagram of a multi-level ramp generator in various examples.
FIG. 7a is an example flip flop to provide a masking clock signal.

FIG. 4 is an example of the multi-level ramp generator
202 for use in an amplifier, such as the amplifier 200
described above with reference to FIG. 2. The multi-level
ramp generator 202 is configured to provide a multi-level
ramp, such as the multi-level ramp 340 described above with
reference to FIG. 3c. The multi-level ramp generator 202
includes a bias voltage common mode (VCM) generator
402, a reference voltage generator 404, and three ramp
generators, which are: high ramp generator 406, middle
ramp generator 408, and low ramp generator 410. In FIG. 3c,
each ramp has a different common mode voltage level. The
bias VCM generator 402 provides a VCM reference signal
for each ramp generator, including: VCM_HI 412 for high
ramp generator 406, VCM_MID 414 for middle ramp gen-
erator 408, and VCM_LO 416 for low ramp generator 410.
In other examples, the bias VCM generator 402 provides a
single VCM, such as VCM_MID 414, for the three ramp
generators 406, 408, 410. VCM_HI 412 and VCM_LO 416
are then provided using the peak-to-peak voltages of each
ramp and the voltage difference relative to VCM_MID 414.

Reference voltage generator 404 provides a high voltage
reference signal and a low voltage reference signal for each
ramp generator to indicate the upper and lower voltages of
each ramp, such as voltages V0, V1, V1', V2, V2', and V3
described herein with reference to FIGS. 3a-3c. Reference
voltage generator 404 provides REFHI_HI 418 and
REFHI_LO 420 for high ramp generator 406, which: (a) in
the example of FIG. 3b are V3 and V2; and (b) in the
example of FIG. 3c are V3 and V2'. Reference voltage
generator 404 provides REFMID_HI 422 and REFMID_LO
424 for middle ramp generator 408, which: (a) in the
example of FIG. 3b are V2 and V1; and (b) the example of
FIG. 3c are V2' and V1'. Reference voltage generator 404
provides REFLO_HI 426 and REFLO_LO 428 for low ramp
generator 410, which: (a) in the example of FIG. 3b are V1
and V0; and (b) in the example of FIG. 3c are V1' and V0.
REFHI_LO 420 and REFMID_HI 422 are the same voltage.
Similarly, REFMID_LO 424 and REFLO_HI 426 are the
same voltage. REFHI_LO 420 and REFMID_HI 422 or
REFMID_LO 424 and REFLO_HI 426 may be within a
certain threshold of similarity to be considered the same
voltage. The thresholds of similarity depend on the particu-
lar implementation. In one example, the threshold voltage
similarity is 1%, so the voltages of REFHI_LO 420 and
REFMID_HI 422 or REFMID_LO 424 and REFLO_HI 426
are considered the same if within 1% of each other.

Each of high ramp generator 406, middle ramp generator
408, and low ramp generator 410 receive the appropriate
VCM signal from bias VCM generator 402, the appropriate
high voltage reference signal and low voltage reference
signal from reference voltage generator 404, and the same
clock reference signal. From these inputs, high ramp gen-
erator 406 provides RAMP_HI 218, middle ramp generator
408 provides RAMP_MID 220, and low ramp generator 410
provides RAMP_LO 222.

Figure 5A:
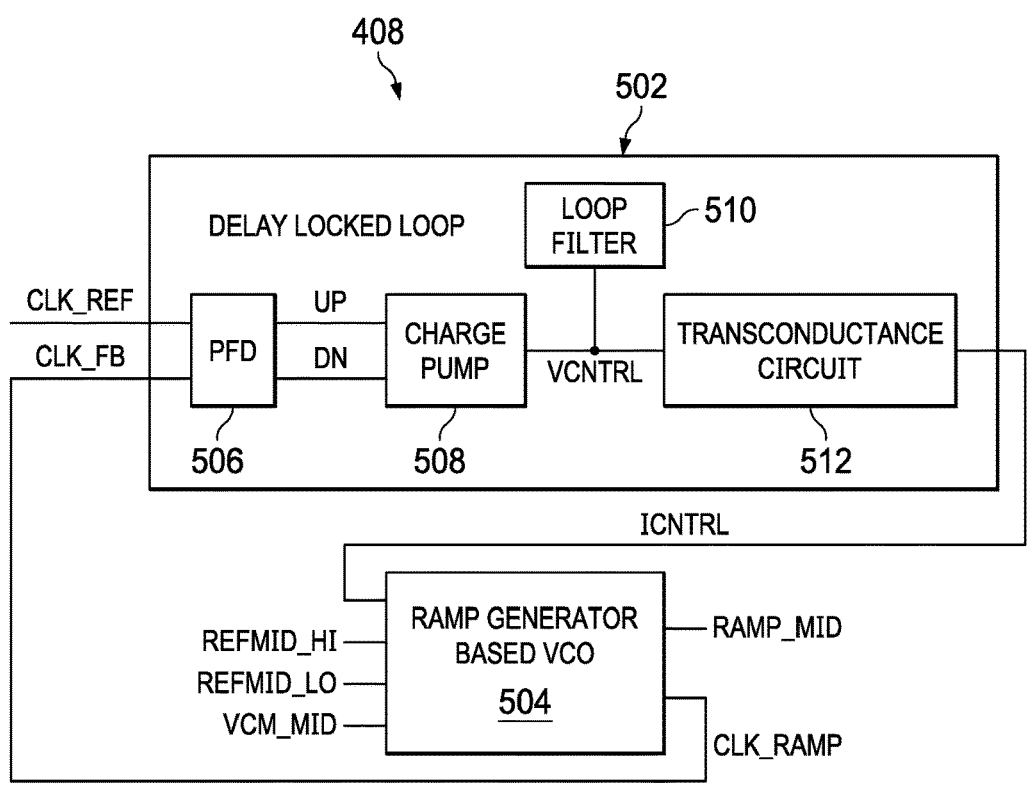
FIGS. 5a and 5b are block diagrams of example ramp generators of the multi-level ramp generator of FIG. 4.

FIG. 5a is an example of the middle ramp generator 408
in multi-level ramp generator 202. Middle ramp generator 408 includes a delay locked loop (DLL) 502 and a ramp
generator based voltage controlled oscillator (VCO) 504.
The DLL 502 allows multi-level ramp generator 202 to
synchronize the frequencies of the provided ramps to a
single reference clock, and includes a phase-frequency
detector (PFD) 506, a charge pump 508, a loop filter 510,
and a transconductance circuit 512. The PFD 506 receives
the reference clock signal CLK_REF and a clock feedback
signal CLK_FB, and provides output signals UP and DN,
which are square waves with a pulse width proportional to
the phase difference between CLK_REF and CLK_FB.
Charge pump 508 receives UP and DN from PFD 506 and
works in conjunction with loop filter 510 as an integrator to
provide a voltage control signal VCNTRL. VCNTRL is
converted to a current control signal ICNTRL through
transconductance circuit 512.

Ramp generator based VCO 504 receives ICNTRL, as
well as the high reference voltage signal and the low voltage
reference signal for the particular ramp generator (e.g.,
REFMID_HI 422 and REFMID_LO 424 for the middle
ramp generator 408), such as those provided by reference
voltage generator 404. In FIG. 5a, the ramp generator based
VCO 504 provides as an output the middle ramp signal
(RAMP_MID 220) for the middle ramp generator 408. The
ramp generator based VCO 504 also provides as an output
a ramp clock signal CLK_RAMP, which has a frequency
approximately equal to the middle ramp signal
(RAMP_MID 220). In the middle ramp generator 408, the
ramp clock signal is also the clock feedback signal
CLK_FB. For example, the ramp generator based VCO 504
receives VCM_MID 414, REFMID_HI 422, and
REFMID_LO 424 and provides as an output RAMP_MID
220. The ramp provided by ramp generator based VCO 504
is provided to other components in the amplifier 200, such
as comparison logic circuit 208, while CLK_FB is provided
to PFD 506 in a closed feedback loop.

Figure 5B:
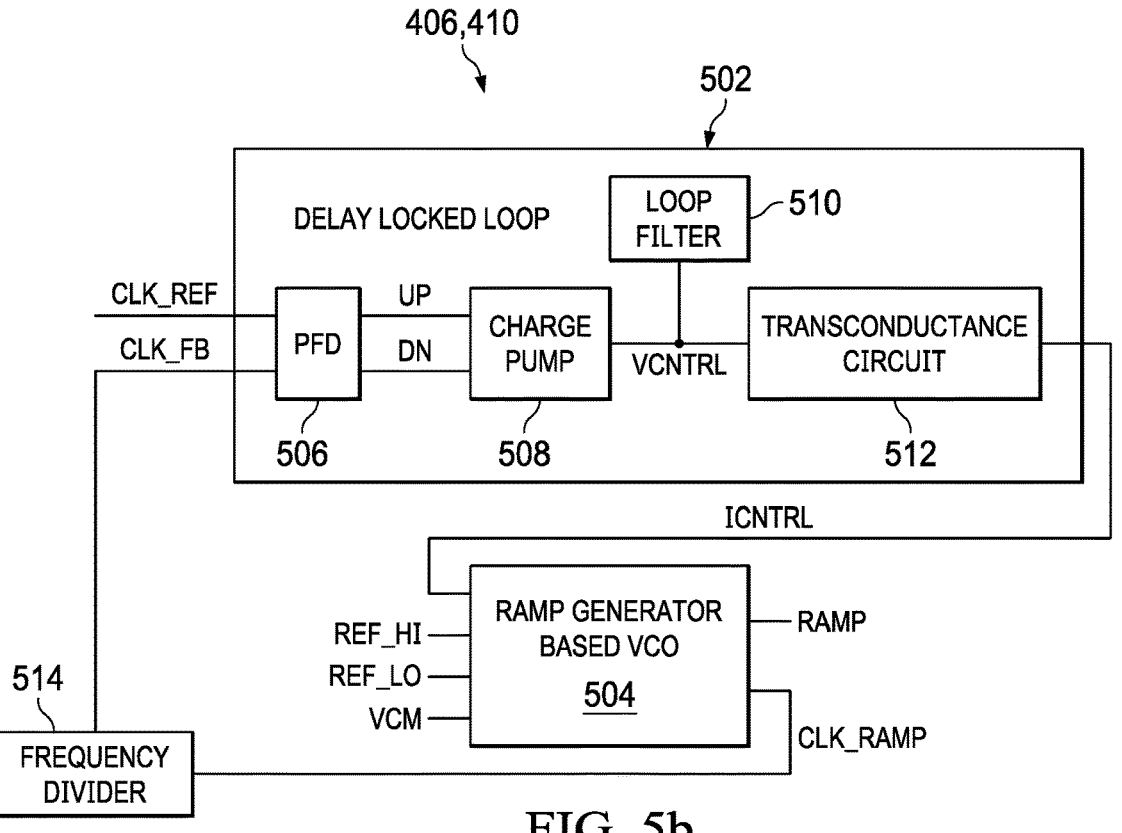

FIG. 5b is an example of the high and low ramp genera-
tors 406, 410 in multi-level ramp generator 202. The high
and low ramp generators 406, 410 include certain compo-
nents that are similar to those described above with respect
to the middle ramp generator 408. For example, the high and
low ramp generators 406, 410 include a DLL 502 and a ramp
generator based VCO 504. The high and low ramp genera-
tors 406, 410 also include a PFD 506, a charge pump 508,
a loop filter 510, and a transconductance circuit 512. These
similar components function as described above with respect
to FIG. 5a.

In the example of FIG. 5b, the ramp generator based VCO
504 receives ICNTRL, as well as the high reference voltage
signal and the low voltage reference signal for the particular
ramp generator (e.g., REFHI_HI 418 and REFHI_LO 420
for the high ramp generator 406 and REFLO_HI 426 and
REFLO_LO 428 for the low ramp generator 410), such as
those provided by reference voltage generator 404. In FIG.
5b, the ramp generator based VCO 504 provides as an output
the high ramp signal (RAMP_HI 218) for the high ramp
generator 406 or the low ramp signal (RAMP_LO 222) for
the low ramp generator 410. The ramp generator based VCO
504 also provides as an output a ramp clock signal
CLK_RAMP, which has a frequency approximately equal to
the frequency of the high or low ramp signals. For example,
the ramp generator based VCO 504 receives VCM_HI 412,
REFHI_HI 418, and REFHI_LO 420 and provides as an
output RAMP_HI 218. Similarly, the ramp generator based
VCO 504 receives VCM_LO 416, REFLO_HI 426, and
REFLO_LO 428 and provides as an output RAMP_LO 222.
As described above, the folded high ramp 322 is approximately 180 degrees out of phase with the folded low ramp 324. Thus, in one example, in the high ramp generator 406, the ramp generator based VCO 504 provides as an output the high ramp signal (RAMP_HI 218). Continuing this example, in the low ramp generator 410, the ramp generator based VCO 504 provides as an output the low ramp signal (RAMP_LO 222) as a signal inverted with respect to the high ramp signal (RAMP_HI 218).

Unlike the middle ramp generator 408 described above with respect to FIG. 5a, the high and low ramp generators 406, 410 also include a frequency divider 514. The frequency divider 514 receives the ramp clock signal CLK_RAMP as an input and provides the clock feedback signal CLK_FB as an output. The frequency divider 514 is configured to provide its output signal (e.g., CLK_FB) having a divided frequency (e.g., having a frequency that is divided by an integer relative to another frequency) of its input signal (e.g., CLK_RAMP). In one example, the frequency of CLK_FB is approximately half that of CLK_RAMP. In this example, because CLK_FB is provided to PFD 506 in a closed feedback loop, in the high and low ramp generators 406, 410, the frequency of CLK_RAMP—and thus RAMP_HI 218 and RAMP_LO 222—is approximately twice that of the similar signals produced by the middle ramp generator 408. Similar to the middle ramp generator 408, the ramps provided by the ramp generator based VCO 504 in the high ramp generator 406 and the low ramp generator 410 are provided to other components in the amplifier 200, such as comparison logic circuit 208.

As described above, the use of three ramp signals, each with different common mode voltage levels, captures information related to the negative parts of INTP 214 and INTM 216 that would be outside the voltage range covered by only two ramp signals. This reduces common mode error and the total harmonic distortion of the amplifier 200. Also, by folding the high ramp 342 and the low ramp 346 (e.g., by doubling the frequency of RAMP_HI 218 and RAMP_LO 222 relative to RAMP_MID 220), the range of the overall multi-level ramp (e.g., multi-level ramp 340) provided by multi-level ramp generator 202 is increased, which maintains increased linearity and renders the amplifier 200 less susceptible to noise or other disturbances.

Figure 6:
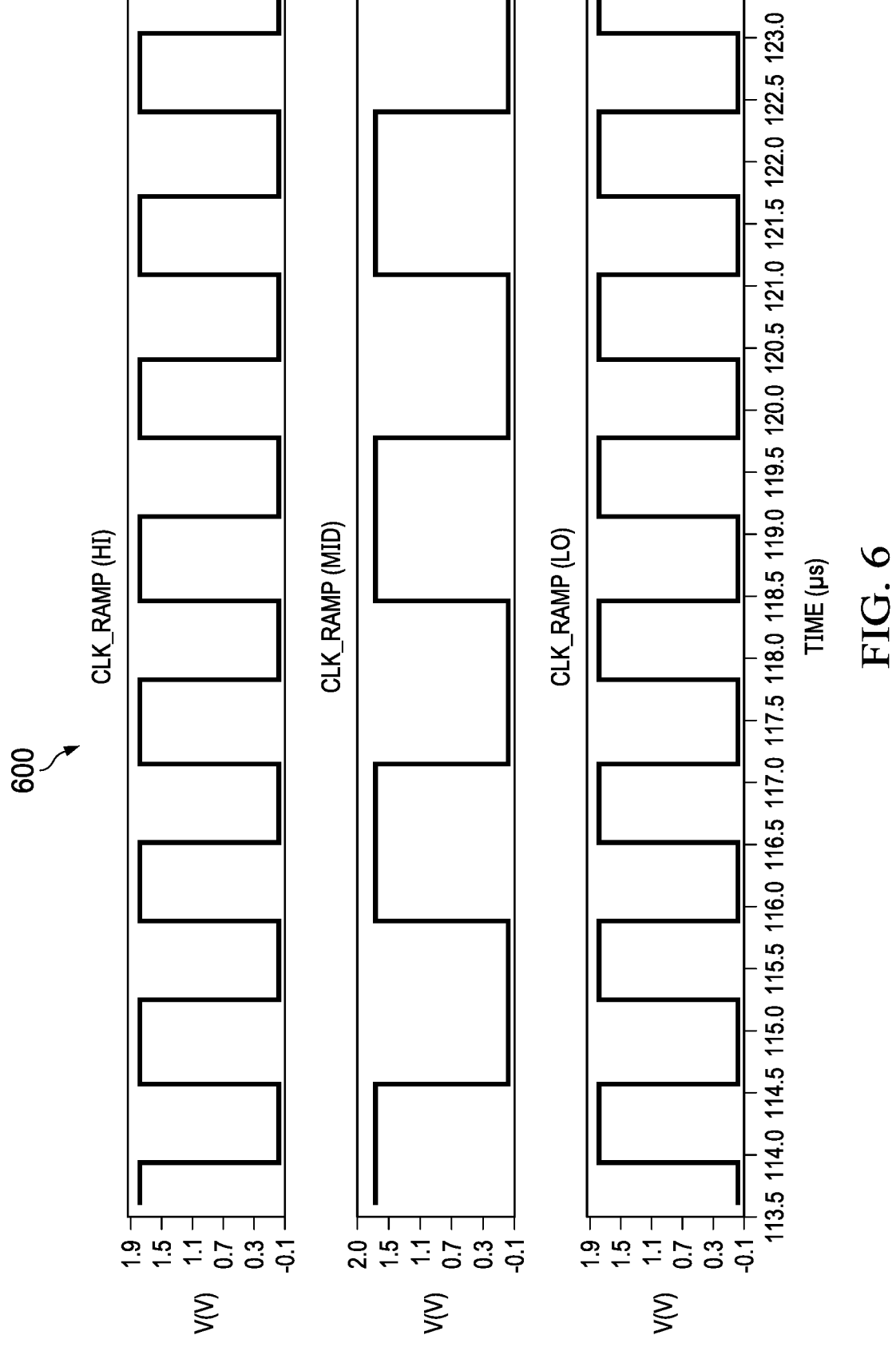
FIG. 6 is a graph of various waveforms of clock signals by the example ramp generators.

FIG. 6 is a graph 600 of various waveforms of ramp clock signals (e.g., voltages as a function of time) provided by the ramp generators in various examples. The CLK_RAMP (HI) waveform is the ramp clock signal provided by the ramp generator based VCO 504 of the high ramp generator 406. The CLK_RAMP (MID) waveform is the ramp clock signal provided by the ramp generator based VCO 504 of the middle ramp generator 408. The CLK_RAMP (LO) waveform is the ramp clock signal provided by the ramp generator based VCO 504 of the low ramp generator 410. The graph 600 demonstrates that the frequencies of the ramp clock signals of the high ramp generator 406 and the low ramp generator 410 (and the related high and low ramps) are twice that of the ramp clock signal of the middle ramp generator 408 (and the related middle ramp). As described above, the frequency divider 514 in the high ramp generator 406 and the low ramp generator 410 divides (e.g., by 2) the frequencies of the ramp clock signal CLK_RAMP (HI) and the ramp clock signal CLK_RAMP (LO). Accordingly, the closed feedback loop in each of the ramp generators 406, 408, 410 synchronizes the ramp clock signals of the high ramp generator 406 and the low ramp generator 410 (having twice the frequency) with the ramp clock signal of the middle ramp generator 408. Also, as described above, because the folded high ramp 322 is approximately 180 degrees out of phase with the folded low ramp 324, CLK_RAMP (HI) is also approximately 180 degrees out of phase with CLK_RAMP (LO).

FIG. 7a is an example flip flop 700 configured to provide a masking clock signal. As described above, portions (e.g., the regions 326, 328 of FIG. 3b or the regions 348, 350 of FIG. 3c) of the resulting pulse width modulated signals (which would be provided based on the comparison of the folded high ramp (e.g., RAMP_HI 218) and the folded low ramp (e.g., RAMP_LO 222) to the input signals INTP 214, INTM 216) are masked to correct for, or otherwise mitigate, the impact of doubling the frequency of RAMP_HI 218 and RAMP_LO 222 relative to unfolded high and low ramps. In one example, a masking clock signal is derived from CLK_RAMP (HI) to mask the resulting pulse width modulated signals that are provided based on the comparison of RAMP_HI 218 to the input signals INTP 214, INTM 216. Similarly, a masking clock signal is derived from CLK_RAMP (LO) to mask the resulting pulse width modulated signals that are provided based on the comparison of RAMP_LO 222 to the input signals INTP 214, INTM 216. The example of FIG. 7a is with respect to generating the masking clock signal based on CLK_RAMP (HI), but a similar approach is also used to provide the masking clock signal based on CLK_RAMP (LO).

For example, FIG. 7a includes a flip flop 700 having a clock input (CLK), a D input (D), and an output (Q). The flip flop 700 D input receives the CLK_RAMP (MID) signal, while the flip flop 700 CLK input receives the CLK_RAMP (HI) signal, an inverse of which is created by an inverter 702. Accordingly, a falling edge of CLK_RAMP (HI) causes the flip flop 700 to latch the value of CLK_RAMP (MID) to the Q output. The Q output is the masking clock signal to mask the resulting pulse width modulated signals that are provided based on the comparison of RAMP_HI 218 to the input signals INTP 214, INTM 216. This masking clock signal is denoted as CLK_RAMP_HI_MASK.

Figure 7B:
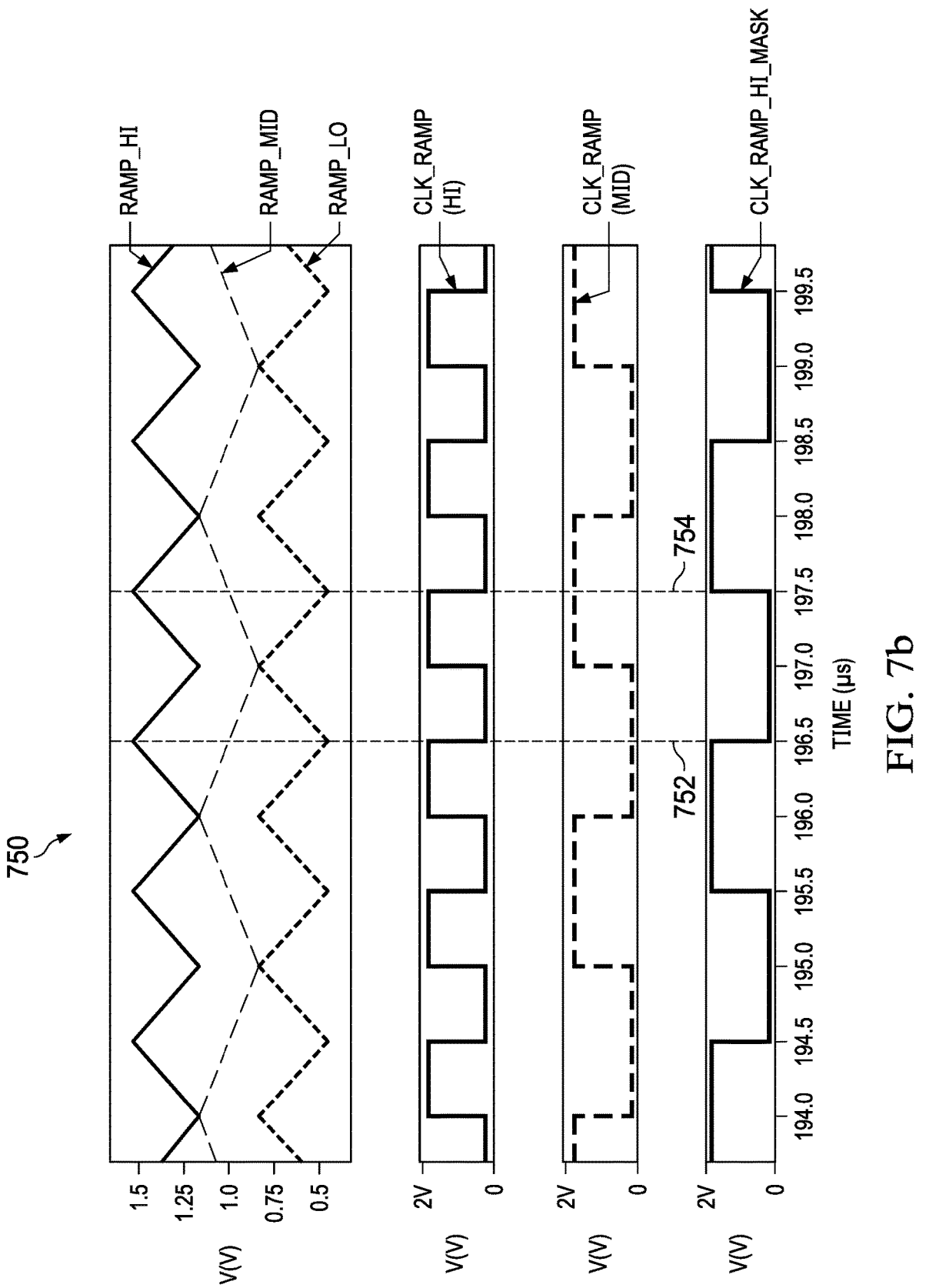
FIG. 7b is a graph of various waveforms of clock signals and a masking clock signal in various examples.

FIG. 7b is a graph 750 of various waveforms demonstrating the generation of a masking clock signal in various examples. The graph 750 includes example RAMP_HI 218, RAMP_MID 220, and RAMP_LO 222 waveforms, along with CLK_RAMP (HI) and CLK_RAMP (MID). The example of FIG. 7b pertains to generating the masking clock signal based on CLK_RAMP (HI), but a similar approach is also used to provide the masking clock signal based on CLK_RAMP (LO). Thus, the graph 750 also includes a waveform for the resultant CLK_RAMP_HI_MASK provided by the flip flop 700, described above. At time 752, a falling edge occurs in the CLK_RAMP (HI) signal, which, due to the inverter 702, causes the flip flop 700 to latch the value of CLK_RAMP (MID), which is deasserted at time 752, as the output CLK_RAMP_HI_MASK. Later, at time 754, a second falling edge occurs in the CLK_RAMP (HI) signal, which again, due to the inverter 702, causes the flip flop 700 to latch the value of CLK_RAMP (MID), which is asserted at time 754, as the output CLK_RAMP_HI_MASK. This continues such that the masking clock signal CLK_RAMP_HI_MASK is deasserted (e.g., to mask the resulting pulse width modulated signal) to correct for, or otherwise mitigate, the impact of doubling the frequency of RAMP_HI 218. As described, a similar approach is used to provide the masking clock signal (CLK_RAMP_LO_MASK) based on CLK_RAMP (LO). The impact of the masking clock signals CLK_RAMP_HI_MASK and CLK_RAMP_LO_MASK are described below with respect to FIG. 8.

Figure 8:
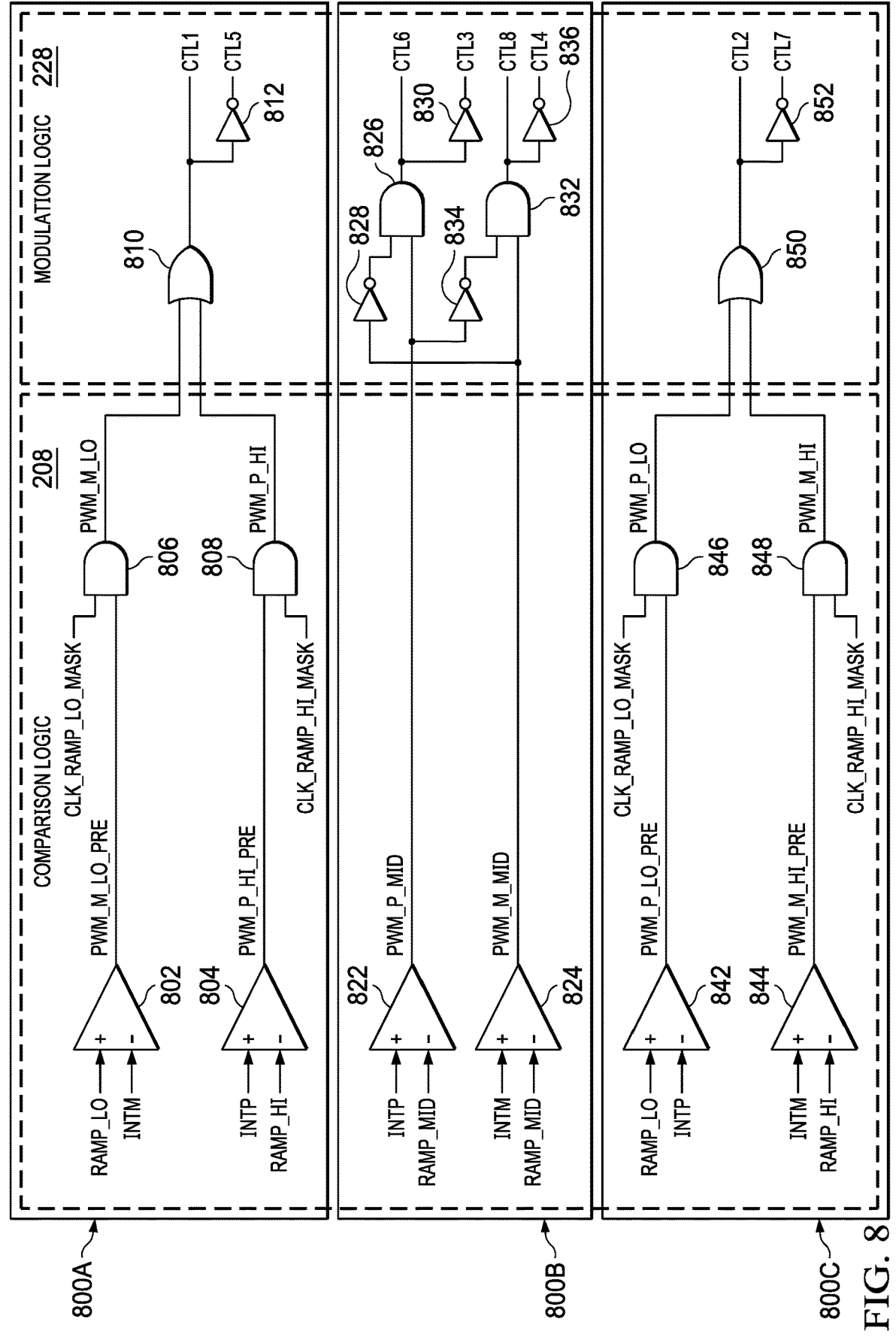
FIG. 8 is a schematic diagram of comparison logic and modulation logic in the amplifier of FIG. 2 in various examples.

FIG. 8 is an example of comparison logic circuit 208 and modulation logic circuit 228 in the amplifier 200 of FIG. 2. As described above with reference to FIG. 2, comparison logic 208 compares INTP 214 and INTM 216 to the ramps RAMP_HI 218, RAMP_MID 220, and RAMP_LO 222 provided by multi-level ramp generator 202. The results of these comparisons are used by controller 210 to provide appropriate control signals for elements (e.g., the transistors M1-M8) within output stage 100. Analysis blocks 800A, 800B, and 800C show operation of comparison logic 208 and modulation logic 228. Analysis block 800A results in control signals for M1 and M5; analysis block 800B results in control signals for M3, M4, M6, and M8; and analysis block 800C results in control signals for M2 and M7.

In analysis block 800A, comparator 802 compares RAMP_LO and INTM, and provides as an output a pulse width modulated signal (PWM_M_LO_PRE) that is: logic high responsive to RAMP_LO being greater than INTM; and logic low responsive to RAMP_LO being less than INTM. Comparator 804 compares INTP and RAMP_HI, and provides as an output a pulse width modulated signal (PWM_P_HI_PRE) that is: logic high responsive to INTP being greater than RAMP_HI; and logic low responsive to INTP being less than RAMP_HI.

As described above, portions (e.g., the regions 326, 328 of FIG. 3b and/or the regions 348, 350 of FIG. 3c) of the resulting pulse width modulated signals (which would be provided based on the comparison of RAMP_HI (e.g., the folded high ramp 322, 342) to INTP or RAMP_LO (e.g., the folded low ramp 324, 346) to INTM) are masked to correct for, or otherwise mitigate, the impact of doubling the frequency of RAMP_HI and RAMP_LO relative to unfolded high and low ramps. Thus, the analysis block 800A includes AND gate 806, which receives: PWM_M_LO_PRE as a first input; and the masking clock signal CLK_RAMP_LO_MASK as a second input. The output of the AND gate 806 is a masked pulse width modulated signal (PWM_M_LO). The analysis block 800A also includes AND gate 808, which receives: PWM_P_HI_PRE as a first input; and the masking clock signal CLK_RAMP_HI_MASK as a second input. The output of the AND gate 808 is a masked pulse width modulated signal (PWM_P_HI).

OR gate 810 in modulation logic 228 receives the masked pulse width modulated output signals of the AND gates 806, 808, and provides as an output CTL1 for M1 in output stage 100. M1 and M5 cannot be on at the same time, because only one of VLINK or VBATT is provided to the OUTP node 112 at a particular time, so CTL1 passes through inverter 812 to become CTL5 for M5. Thus, analysis block 800A results in the control signals for M1 and M5.

In analysis block 800B, comparator 822 compares INTP and RAMP_MID, and provides as an output a pulse width modulated signal (PWM_P_MID) that is: logic high responsive to INTP being greater than RAMP_MID; and logic low responsive to INTP being less than RAMP_MID. Comparator 824 compares INTM and RAMP_MID, and provides as an output a pulse width modulated signal (PWM_M_MID) that is: logic high responsive to INTM being greater than RAMP_MID; and logic low responsive to INTM being less than RAMP_MID. Because the frequency of RAMP_MID is not doubled, the pulse width modulated output signals PWM_P_MID and PWM_M_MID are not masked, and are provided as inputs to modulation logic 228.

AND gate 826 in modulation logic 228 receives: the output signal of comparator 822 directly; and the output signal of comparator 824 after it is inverted by inverter 828. AND gate 826 provides as an output CTL6 for M6 in output stage 100. M6 and M3 cannot be on at the same time, because only one of VBATT or ground is provided to the OUTP node 112 at a particular time, so CTL6 passes through inverter 830 to become CTL3 for M3. Thus, analysis block 800B results in the control signals for M3 and M6.

AND gate 832 in modulation logic 228 receives the output signal of comparator 824 directly, and the output signal of comparator 822 after it is inverted by inverter 834. AND gate 832 provides as an output CTL8 for M8 in output stage 100. M8 and M4 cannot be on at the same time, because only one of VBATT or ground is provided to the OUTM node 114 at a particular time, so CTL8 passes through inverter 836 to become CTL4 for M4. Thus, analysis block 800B also results in the control signals for M4 and M8.

In analysis block 800C, comparator 842 compares RAMP_LO and INTP, and provides as an output a pulse width modulated signal (PWM_P_LO_PRE) that is: logic high responsive to RAMP_LO being greater than INTP; and logic low responsive to RAMP_LO being less than INTP. Comparator 844 compares INTM and RAMP_HI, and provides as an output a pulse width modulated signal (PWM_M_HI_PRE) that is: logic high responsive to INTM being greater than RAMP_HI; and logic low responsive to INTM being less than RAMP_HI.

As described above, portions of the resulting pulse width modulated signals (which would be provided based on the comparison of RAMP_HI to INTM or RAMP_LO to INTP) are masked to correct for, or otherwise mitigate, the impact of doubling the frequency of RAMP_HI and RAMP_LO relative to unfolded high and low ramps. Thus, the analysis block 800C includes AND gate 846, which receives: PWM_P_LO_PRE as a first input; and the masking clock signal CLK_RAMP_LO_MASK as a second input. The output of the AND gate 846 is a masked pulse width modulated signal (PWM_P_LO). The analysis block 800C also includes AND gate 848, which receives: PWM_M_HI_PRE as a first input; and the masking clock signal CLK_RAMP_HI_MASK as a second input. The output of the AND gate 848 is a masked pulse width modulated signal (PWM_M_HI).

OR gate 850 in modulation logic 228 receives the masked pulse width modulated output signals of the AND gates 846, 848, and provides as an output CTL2 for M2 in output stage 100. M2 and M7 cannot be on at the same time, because only one of VLINK or VBATT is provided to the OUTM node 114 at a particular time, so CTL2 passes through inverter 852 to become CTL7 for M7. Thus, analysis block 800C results in the control signals for M2 and M7.

The AND gates 806, 808, 846, 848 are shown schematically as part of comparison logic 208, so the modulation logic 228 receives PWM_M_LO, PWM_P_HI, PWM_P_LO, and PWM_M_HI from the comparison logic 208. However, in another example, the AND gates 806, 808, 846, 848 are part of modulation logic 228, so the modulation logic 228 receives PWM_M_LO_PRE, PWM_P_HI_PRE, PWM_LO_P_PRE, and PWM_M_HI_PRE from the comparison logic 208.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

While certain components may be described herein as being of a particular process technology, these components may be exchanged for components of other process technologies. Circuits described herein are reconfigurable to include the replaced components to provide functionality at least partially similar to functionality available before the component replacement. Components illustrated as resistors, unless otherwise stated, are generally representative of any one or more elements coupled in series and/or parallel to provide an amount of impedance represented by the illustrated resistor. For example, a resistor or capacitor illustrated and described herein as a single component may instead be multiple resistors or capacitors, respectively, coupled in series or in parallel between the same two nodes as the single resistor or capacitor. Also, uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

Modifications are possible in the described embodiments, and other embodiments are possible, within the scope of the claims.

What is claimed is:

1. An apparatus comprising:
a power stage having a first power stage input, a second power stage input, and a power stage output;
a modulator circuit having a first ramp input, a second ramp input, a modulator input, a first modulator output, and a second modulator output, the first modulator output coupled to the first power stage input, and the second modulator output coupled to the second power stage input; and
a ramp generator having a first ramp output and a second ramp output, the first ramp output coupled to the first ramp input, and the second ramp output coupled the second ramp input, the ramp generator configurable to provide a first ramp signal at the first ramp output and a second ramp signal at the second ramp output, the first ramp signal having a different frequency from the second ramp signal.

2. The apparatus of claim 1, wherein the modulator input is coupled to an audio input, and the power stage output is coupled to a speaker output.

3. The apparatus of claim 2, further comprising a subtractor circuit having a first subtractor input, a second subtractor input, and a subtractor output, the first subtractor input coupled to the audio input, the second subtractor input coupled to the power stage output, and the subtractor output coupled to the modulator input.

4. The apparatus of claim 3, further comprising a loop filter coupled between the subtractor output and the modulator input.

5. The apparatus of claim 1, wherein the modulator circuit is configured to provide a first control signal at the first modulator output responsive to a comparison between a signal at the modulator input and the first ramp signal, and provide a second control signal at the second modulator output responsive to a comparison between the signal and the second ramp signal.

6. The apparatus of claim 5, wherein the power stage output is a first power stage output, the power stage has a second power stage output and a third power stage input and includes: a first transistor coupled between a first power terminal and the first power stage output; a second transistor coupled between the first power stage output and a ground terminal; a third transistor coupled between a second power terminal and the first power stage output; and wherein the first transistor has a first control terminal, the second transistor has a second control terminal, the third transistor has a third control terminal, and the fourth transistor has a fourth control terminal; and
wherein the first control terminal is coupled to the first power stage input, the second and third control terminals are coupled to the second power stage input, and the fourth control terminal is coupled to the third power stage input.

7. The apparatus of claim 6, wherein the ramp generator has a third ramp output, and the modulator circuit has a third ramp input coupled to the third ramp output; and
wherein the ramp generator is configurable to provide a third ramp signal at the third ramp output, the third ramp having a same frequency as the first ramp signal.

8. The apparatus of claim 7, wherein first ramp signal has a first voltage range, the second ramp signal has a second voltage range, and the third ramp signal has a third voltage range, the second voltage range being between the first voltage range and the second voltage range.

9. The apparatus of claim 7, wherein the modulator circuit has a clock input and a third modulator output coupled to the third power stage input, and the modulator circuit is configured to:
responsive to a clock signal at the clock input having a first state, provide the first control signal at the first modulator output responsive to the comparison between the signal at the modulator input and the first ramp signal;
provide the second control signal at the second modulator output responsive to comparison between the signal and the second ramp signal; and
responsive to the clock signal having a second state, provide a third control signal at the third modulator output responsive to a comparison between the signal and the third ramp signal.

10. The apparatus of claim 9, wherein a frequency of the second ramp signal is half of the respective frequency of the first and third ramp signals.

11. The apparatus of claim 9, wherein the first ramp signal is 180 degrees out of phase with respect to the third ramp signal.

12. The apparatus of claim 9, wherein a frequency of the clock signal is half of a frequency of the first ramp signal.

13. The apparatus of claim 9, wherein the clock input is a first clock input, the clock signal is a first clock signal, the ramp generator has a first ramp clock input and a second ramp clock input, the first ramp clock input coupled to the first clock input, the second ramp clock input coupled to a second clock input, and the ramp generator is configured to:

provide the first and third ramp signals responsive to the first clock signal; and provide the second ramp signal responsive to a second clock signal at the second clock input, in which a frequency of the second clock signal is half of a frequency of the first clock signal.

14. The apparatus of claim 9, wherein the signal is a first signal, the modulator input is a first modulator input, the modulator circuit has a second modulator input and configured to:

responsive to the clock signal having the first state:

provide the first control signal responsive to the comparison between the first signal and the first ramp signal; and provide the second control signal responsive to a comparison between a second signal at the second modulator input and the first ramp signal; and responsive to the clock signal having the second state:

provide the first control signal responsive to a comparison between the second signal and the third ramp signal; and provide the third control signal responsive to the comparison between the first signal and the first ramp signal.

15. The apparatus of claim 14, wherein the power stage has a fourth power stage input, the modulator circuit has a fourth modulator output coupled to the fourth power stage input, and the modulator circuit is configured to provide a fourth control signal at the fourth modulator output responsive to a comparison between the second signal and the third ramp signal.

16. The apparatus of claim 15, wherein the modulator circuit is configured to provide the second control signal responsive to the comparison between the first signal and the second ramp signal, and provide the fourth control signal responsive to the comparison between the second signal and the second ramp signal.

17. The apparatus of claim 15, further comprising:

a fifth transistor coupled between the second power terminal and the second power stage output, the fifth transistor having a fifth control terminal coupled to the fourth power stage input; and a sixth transistor coupled between the second power terminal and the ground terminal, the sixth transistor having a sixth control terminal coupled to the fourth power stage input.

18. The apparatus of claim 17, wherein each of the first through sixth transistors includes a respective laterally diffused metal oxide semiconductor (LDMOS) FET.

19. The apparatus of claim 6, further comprising a circuit having an input and an output, the input coupled to the second power terminal, and the output coupled to the first power terminal, the circuit configurable to receive a first voltage at the input and provide a second voltage based on the first voltage, the second voltage being higher than the first voltage.

20. The apparatus of claim 19, wherein the circuit includes a charge pump.

21. The apparatus of claim 1, wherein the ramp generator includes a delay locked loop and a voltage-controlled oscillator.

* * * * *